(12) United States Patent
McGarry

(10) Patent No.: US 7,805,647 B2
(45) Date of Patent: Sep. 28, 2010

(54) SYSTEM AND METHOD FOR TESTING A PLURALITY OF CIRCUITS

(75) Inventor: Anne-Clotilde McGarry, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 412 days.

(21) Appl. No.: 12/031,776

(22) Filed: Feb. 15, 2008

(65) Prior Publication Data

US 2009/0206863 A1  Aug. 20, 2009

(51) Int. Cl.
*G01R 31/28* (2006.01)
(52) U.S. Cl. .................... 714/724; 324/763
(58) Field of Classification Search .......... 438/18; 29/843; 714/726, 729, 733, 724; 324/763
See application file for complete search history.

(56) References Cited

U.S. PATENT DOCUMENTS

| | | | |
|---|---|---|---|
| 5,532,174 A * | 7/1996 | Corrigan ............... 438/18 |
| 6,032,356 A * | 3/2000 | Eldridge et al. ............... 29/843 |
| 6,199,182 B1 | 3/2001 | Whetsel | |
| 6,219,811 B1 * | 4/2001 | Gruetzner et al. ............ 714/726 |
| 6,954,080 B2 | 10/2005 | Whetsel | |
| 7,417,450 B2 * | 8/2008 | Whetsel ...................... 324/763 |
| 7,571,365 B2 * | 8/2009 | Whetsel ...................... 714/729 |
| 2005/0138503 A1 | 6/2005 | Whetsel | |

\* cited by examiner

*Primary Examiner*—David Ton
(74) *Attorney, Agent, or Firm*—Lawrence J. Bassuk; Wade J. Brady, III; Frederick J. Telecky, Jr.

(57) ABSTRACT

A system for, and method of, testing a plurality of circuits, which may be unsingulated die on a wafer. In one embodiment, the system includes: (1) a test data interconnect that connects a test data output of a first circuit directly to a test data input of a second circuit located adjacent to the first circuit, (2) a test clock interconnect that connects a test clock output of the first circuit directly to a test clock input of the second circuit, (3) a test mode select interconnect that connects a test mode select output of the first circuit directly to a test mode select input of the second circuit and (4) a contact region coupled to provide test data, a test clock signal and a test mode select signal respectively to the test data interconnect, the test clock interconnect and the test mode select interconnect.

21 Claims, 5 Drawing Sheets

SYSTEM AND METHOD FOR TESTING A PLURALITY OF CIRCUITS

TECHNICAL FIELD OF THE INVENTION

The invention is directed, in general, to wafer fabrication and testing and, more specifically, to a system and method for testing a plurality of circuits, including unsingulated dice, packaged ICs and other, non-integrated circuit.

BACKGROUND OF THE INVENTION

Integrated circuit (IC) manufacturers produce dice (or die, the latter sometimes used to denote both the singular and the plural) on typically circular substrates referred to as wafers. A wafer may contain hundreds of individual rectangular or square dice, which are arranged in a two-dimensional array on the wafer. Dice-on-wafer, or "unsingulated" dice, must be tested to determine good from bad before the dice are singulated. Unsingulated die testing traditionally occurs by physically probing each die at its die pads, which allows a tester connected to the probe to determine good and bad dice. This type of probing is relatively slow and requires expensive mechanical mechanisms to step and position the probe accurately at each die location on the wafer. The probing step can damage the die pads which may interfere with the bonding process during IC packaging or assembly of bare dice into a multi-chip module (MCM). Also, as die sizes shrink, pads are positioned closer and closer together, making the job of probing more difficult and expensive.

Alternate conventional methods for testing unsingulated dice on wafers include: (1) designing each die to test itself using built-in-self-test (BIST) circuitry on each die and providing a way to enable each die BIST circuitry to test the die, (2) widening the scribe lanes between the dice to allow for test probe points or test circuitry, (3) processing an overlying layer of semiconductor material with test circuitry over the dice on wafers and providing via connections, from the overlying layer, to the pads of each die on the wafer and (4) providing a separate Joint Test Access Group (JTAG) interface for each die using widened scribe lines for all of the test access conductors.

Method 1 disadvantageously requires BIST circuitry on each die which takes up area, and the BIST circuitry may not be able to test the input/output (I/O) of the dice adequately. Method 2 disadvantageously reduces the number of dice that can be produced on a wafer since the widening of the scribe lanes takes up wafer area which could be used for additional dice. Method 3 disadvantageously requires additional wafer processing steps to form the overlying test connectivity layer on top of the dice on wafers, and also the overlying layer needs to be removed from the wafer after testing is complete. This overlying layer removal step is additive in the process and the underlying dice could be damaged during the removal step. Method 4 is likely to result in more JTAG interfaces than a tester can accommodate. The same holds true outside of the context of unsingulated dice on a wafer; packaged ICs and non-integrated circuits conventionally require separate testing and thus separate JTAG interfaces.

Ideally, only good dice are singulated and packaged into ICs. The cost of packaging dice is expensive, and therefore the packaging of bad dice increases the manufacturing cost of the IC vendor and results in a higher cost to the consumer.

SUMMARY OF THE INVENTION

To address the above-discussed deficiencies of the prior art, the invention provides a system for testing a plurality of circuits, which may be unsingulated dice on a wafer, but may instead be an MCM, packaged ICs on a circuit board or wholly separate circuits, packaged or otherwise. In one embodiment, the system includes: (1) a test data interconnect that connects a test data output of a first circuit directly to a test data input of a second circuit located adjacent to the first circuit, (2) a test clock interconnect that connects a test clock output of the first circuit directly to a test clock input of the second circuit, (3) a test mode select interconnect that connects a test mode select output of the first circuit directly to a test mode select input of the second circuit and (4) a contact region coupled to provide test data, a test clock signal and a test mode select signal respectively to the test data interconnect, the test clock interconnect and the test mode select interconnect.

Another aspect of the invention provides a method of testing a plurality of circuits. One embodiment of the method includes: (1) connecting a test data output of a first circuit directly to a test data input of a second circuit located adjacent to the first circuit, (2) connecting a test clock output of the first circuit directly to a test clock input of the second circuit, (3) connecting a test mode select output of the first circuit directly to a test mode select input of the second circuit, (4) providing test data to the test data input of the second circuit via a contact region and the test data output of the first circuit, (5) providing a test clock signal to the test clock input of the second circuit via the contact region and the test clock output of the first circuit and (6) providing a test mode select signal to the test mode select input of the second circuit via the contact region and the test mode select output of the first circuit.

Yet another aspect of the invention provides a system for testing unsingulated dice on a wafer. One embodiment of the system includes: (1) a test data interconnect that connects test data outputs of the unsingulated dice to test data inputs of the unsingulated dice, (2) a test clock interconnect that connects test clock outputs of the unsingulated dice directly to test clock inputs of the unsingulated dice, (3) a test mode select interconnect that connects test mode select outputs of the unsingulated dice to test mode select inputs of the unsingulated dice and (4) a contact region coupled to provide test data, a test clock signal and a test mode select signal respectively to the test data interconnect, the test clock interconnect and the test mode select interconnect and receive test data from the test data interconnect.

BRIEF DESCRIPTION OF THE DRAWINGS

For a more complete understanding of the invention, reference is now made to the following descriptions taken in conjunction with the accompanying drawings, in which.

DETAILED DESCRIPTION

The Detailed Description that follows is directed to a better way to test a plurality of circuits, including unsingulated dice, MCMs, packaged ICs and other, non-integrated circuits. More specifically, a way to test unsingulated dice is described that avoids BIST circuitry, scribe lanes that are widened to accommodate test probe points or test circuitry, additional process steps or a JTAG interface for each circuit.

Figure 1:
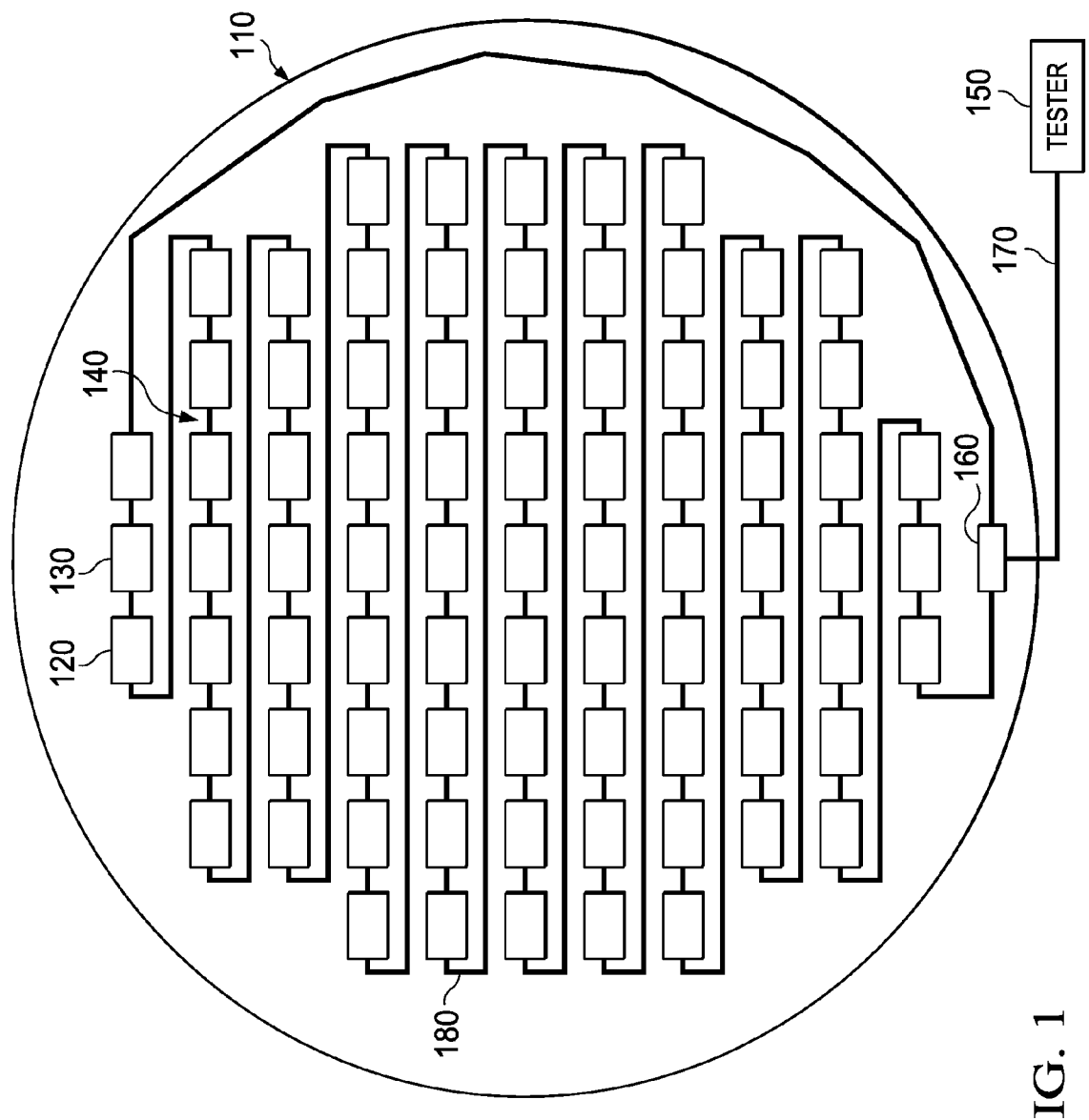
FIG. 1 is a plan view of a wafer containing unsingulated dice and one embodiment of a system for testing a plurality of circuits constructed according to the principles of the invention.
Figure 2:
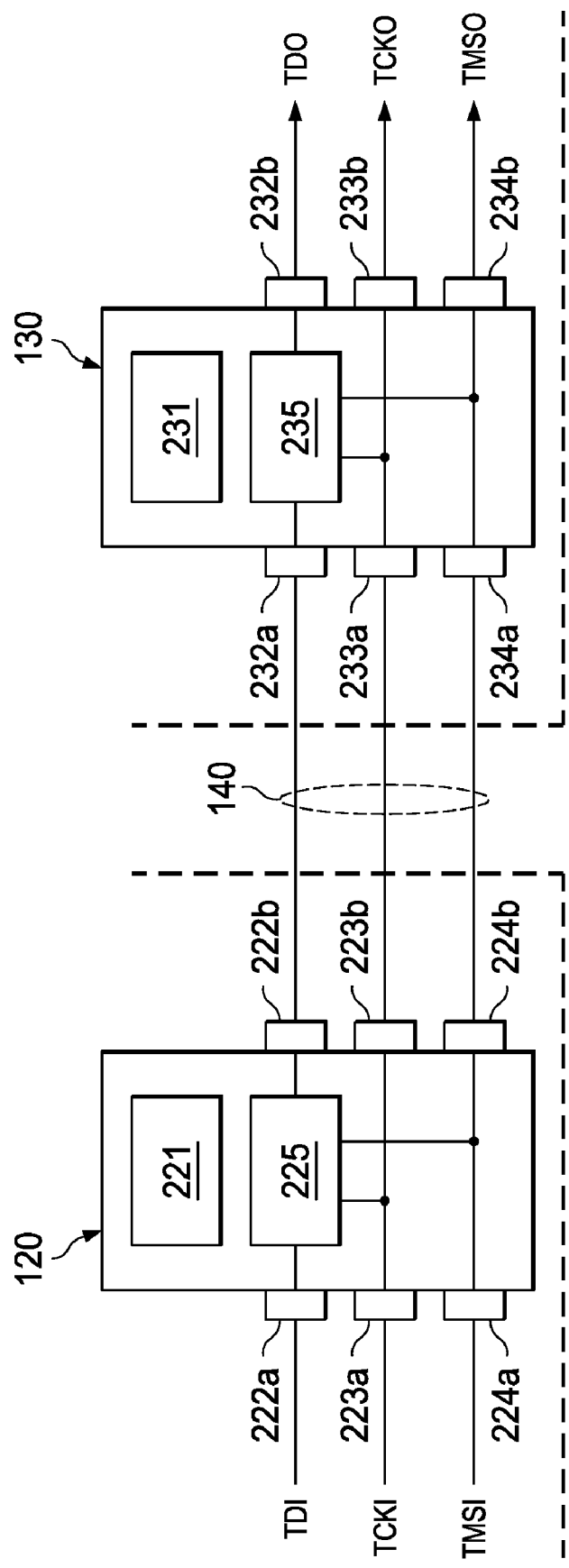
FIG. 2 is a block diagram of a portion of the wafer of FIG. 1.

FIG. 1 is a plan view of a wafer 110 containing unsingulated dice and one embodiment of a system for testing a plurality of circuits, which take the form of the unsingulated dice in the embodiment of FIG. 1. FIGS. 1 and 2 particularly illustrate an embodiment in which sufficient pins are available on each die to accommodate dedicated test pins. This is in contrast with an embodiment to be described in conjunction with FIGS. 3 and 4 in which sufficient pins do not exist and, as a result, test pins must be multiplexed with pins used in normal operation.

Two of the unsingulated dice are referenced as 120, 130. The unsingulated dice 120, 130 and the unreferenced unsingulated dice are of substantially identical size and shape and have identical pin arrangements, or "pinouts," and are aligned in rows and columns on the wafer 110. In an alternative embodiment, the unsingulated dice 120, 130 and the unreferenced unsingulated dice are not of substantially identical shape and size or do not have identical pinouts, and in another alternative embodiment, they are not so aligned.

Separating the unsingulated dice (including the unsingulated dice 120, 130 and the unreferenced unsingulated dice) are scribe lines 140, which also may be called saw lines, streets or avenues. For purposes of illustration, FIG. 1 exaggerates the width of the scribe lines 140. As those skilled in the art understand, the wafer 110 is eventually cut along the scribe lines 140, singulating the unsingulated dice, typically making them ready for packaging. Because area of the wafer 110 contained in the scribe lines 140 is sacrificed during this process, it is generally desirable to have the narrowest possible scribe lines in order to make as much wafer area as possible available for the dice. In the illustrated embodiment, the particular scribe lines 140 are only as wide as they need to be to accommodate singulation.

A tester 150 is coupled to a contact region 160 via an umbilical 170. The tester 150 may be any piece of test equipment (including automated test equipment) capable of generating digital data for transmission to devices-under-test and further capable of receiving digital data from the devices-under-test that ostensibly convey test results. The contact region 160 provides a suitable termination for the umbilical and typically includes several conductive pads. In the illustrated embodiment, the contact region 160 is suitable for conveying signals to enable JTAG (testing that complies with the Institute of Electrical and Electronics Engineers, or IEEE, Std 1149.1). Accordingly, the illustrated embodiment of the contact region 160 has a test data input (TDI) pad, a test data out (TDO) pad, a test clock (TCK) pad and a test mode select (TMS) pad. A ground pad may also be included in the contact region 160, or another kind of ground connection between the wafer 110 and the tester 150 may be established. The contact region 160 need not be a separate region as FIG. 1 shows; it may be associated with one or more of the unsingulated dice 120, 130 and the unreferenced unsingulated dice.

As FIG. 1. shows, only a single contact region 160 exists on the entire wafer 110. Thus, the specific tester 150 of FIG. 1 needs to accommodate only one contact region 160 to test all of the dice on the wafer 110. Alternative embodiments call for multiple contact regions on the wafer 110, but still fewer than the number of dice on the wafer 110.

A bus 180, comprising a plurality of interconnects, extends from the contact region 160 serially through each of the dice, including the dice 120, 130 and back to the contact region 160. In the illustrated embodiment, the test bus 180 takes the form of a JTAG bus. As those skilled in the art understand, the test bus 180 allows data, clock and control signals to be transmitted to the dice to test them. Data signals can also be received from each of the dice to convey test results to the tester 150. Greater detail regarding the test bus 180 will be provided in FIGS. 2 and 4, below. However, with the understanding that each die on the wafer 110 is substantially identical in terms of size and shape and identical in pinout to every other die, FIG. 1 shows that the path the test bus 180 takes as it travels from one die to another in a given row is direct, such that its interconnects along a given row are relatively short and substantially perpendicular to the scribe lines 140 they cross. As FIG. 2 will show, this results from additional outputs on the unsingulated dice that allow the test bus 180 to be routed through the dice, instead of alongside the dice (i.e., in the scribe lines 140).

FIG. 1 also shows that the various interconnects enter at a first (e.g., left) edge of each unsingulated die and exit from a second (e.g., right) edge of the unsingulated die that is opposite the first edge. In an alternative embodiment, the various interconnects enter on a proximal end of a third (e.g., top or bottom) edge of each unsingulated die and exit from either a distal end of the third edge or the distal end of a fourth (e.g., bottom or top) edge opposite the third edge.

FIG. 2 is a block diagram of a portion of the wafer of FIG. 1. The unsingulated die 120 includes functional core logic 221 that is to be tested. The unsingulated die 120 has a test data input (TDI) 222a, a test clock input (TCKI) 223a and a test mode select input (TMSI) 224a. Likewise, the unsingulated die 120 has a test data output (TDO) 222b, a test clock output (TCKO) 223b and a test mode select output (TMSO) 224b. FIG. 2 does not contain labels for TDO 222b, TCKO 223b and TMSO 224b due to a lack of space between the unsingulated dice 120, 130. TCKO 223b is connected to TCKI 223a, and TMSO 224b is connected to TMSI 224a. A test circuit 225, which may be an IEEE Std 1149.1 Test Access Port (TAP) circuit, is connected to TDI 222a and TDO 222b, TCKI 223a and TMSI 224a.

The architecture of an IEEE Std. 1149.1 TAP circuit includes a TAP controller, instruction register, set of data registers including: (1) an internal scan register, (2) an in-circuit emulation (ICE) register, (3) an in-system programming (ISP) register, (4) a boundary scan register, and (5) a bypass register. Of the data registers, IEEE 1149.1 defines the boundary scan register and bypass register. IEEE 1149.1 does not define other data registers, but they can exist in some embodiments. The TAP controller responds to the TCK and TMS signal inputs (note that the test circuit 225 is accordingly coupled to TCKI 223a and TMSI 224a) to coordinate serial communication through either the instruction register from TDI signal to TDO signal, or through a selected one of the data registers from TDI to TDO. The operation of the TAP circuit is well known.

Those skilled in the art understand that TDI 222a, TCKI 223a and TMSI 224a may be used to provide data, clock and control signals to drive the test circuit 225 to test the functional core logic 221. Those skilled in the art further understand that TDO 222b may be used to retrieve test data signals indicating the outcome of tests performed on the functional core logic 221.

The unsingulated die 130 includes functional core logic 231 that is to be tested. The unsingulated die 130 has a TDI 232a, a TCKI 233a and a TMSI 234a. Likewise, the unsingulated die 130 has a TDO 232b, a TCKO 233b and a TMSO 234b. FIG. 2 does not contain labels for TDI 232a, TCKI 233a and TMSI 234a due to a lack of space between the unsingulated dice 120, 130. TCKO 233b is connected to TCKI 233a, and TMSO 234b is connected to TMSI 234a. A test circuit 235 is connected to TDI 232a and TDO 232b, TCKI 233a and TMSI 234a.

As is also evident, an unreferenced test data interconnect connects TDO 222b and TDI 232a. Likewise, an unreferenced test clock interconnect connects TCKO 223b and TCKI 233a, and an unreferenced test mode select interconnect connects TMSO 224b and TMSI 234a. These interconnects are illustrated as transversely crossing the scribe line 140 separating the unsingulated dice 120, 130.

Turning back briefly to FIG. 1, the test bus 180 includes unreferenced test data interconnects, unreferenced test clock interconnects and unreferenced test mode select interconnects that connect the various unsingulated dice to each other and the contact region 160. In one embodiment, the return path from the unreferenced unsingulated die that is to the right of the unsingulated die 130 to the contact region 160 carries only test data signals (results of tests). In an alternative embodiment, the return path carries one or more of the test clock signal or the test mode select signal.

Given the above, multiple circuits (e.g., unsingulated dice) may be tested via a single contact region by the following method. First, the multiple circuits may be coupled to a tester (e.g., automatic JTAG test equipment). Power may then be applied to the multiple circuits. A test clock signal may then be applied to the contact region, which the test bus then carries to each of the multiple circuits. Then appropriate test mode select signals may be applied to the contact region, and test instructions may be applied to the contact region. Then appropriate test mode select signals may be applied to the contact region, and test data may be applied to the contact region. Then appropriate test mode select signals may be applied to the contact region to initiate a test. Finally, appropriate test mode select signals may be applied to the contact region, and test data may be retrieved from the multiple circuits via the contact region and into the tester.

Figure 3:
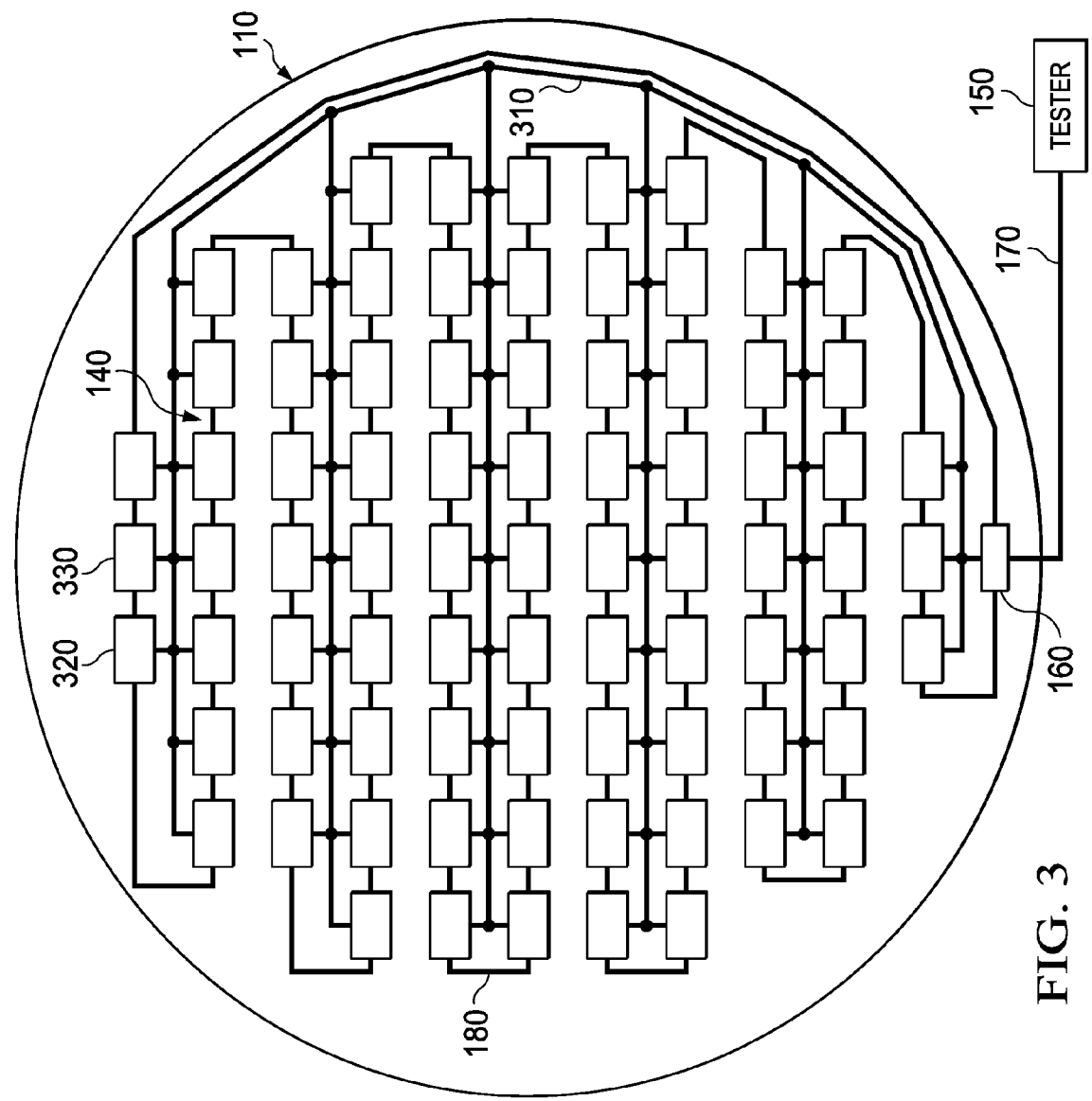
FIG. 3 is a plan view of a wafer containing unsingulated dice and another embodiment of a system for testing a plurality of circuits constructed according to the principles of the invention.
Figure 4:
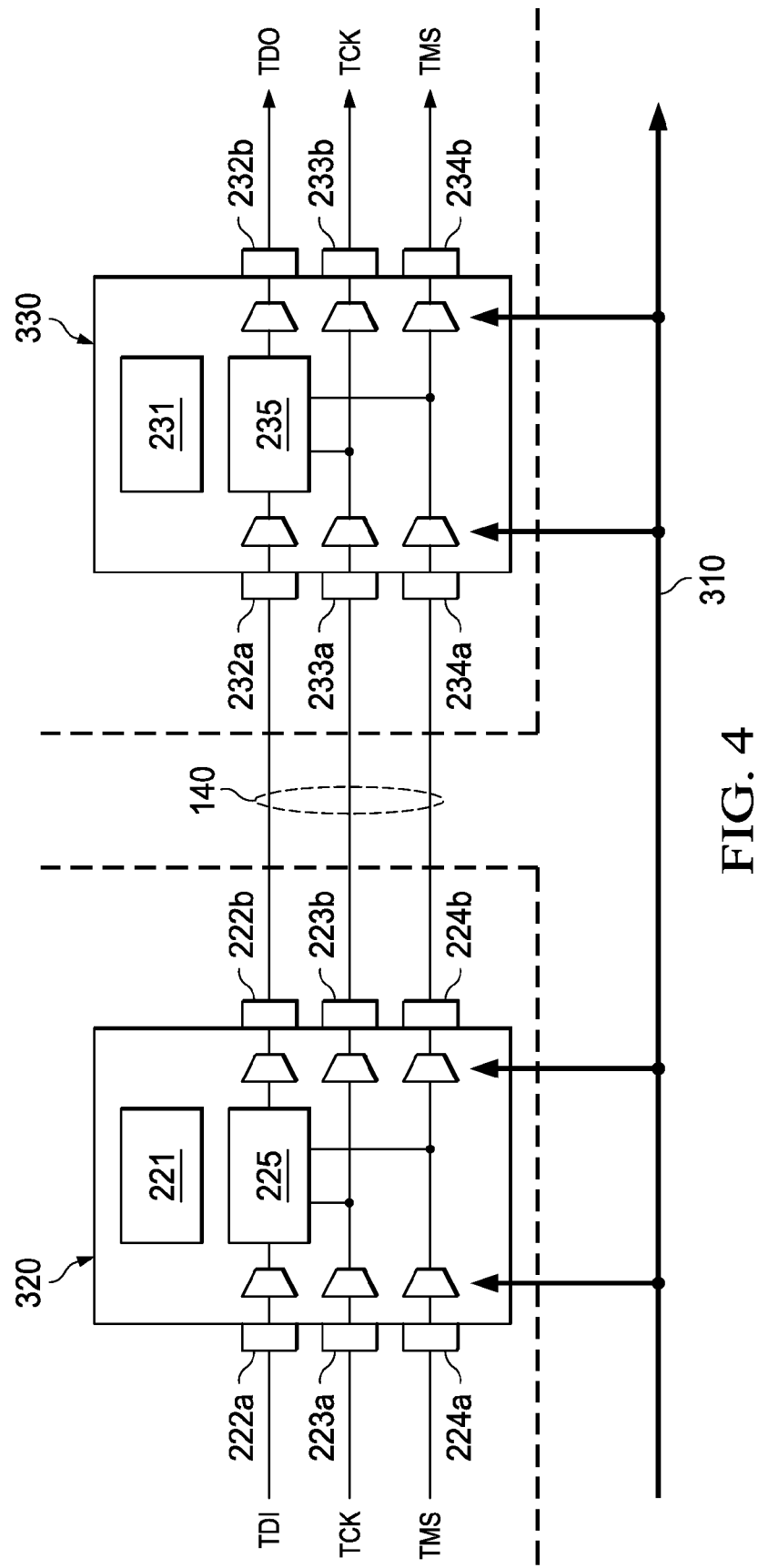
FIG. 4 is a block diagram of a portion of the wafer of FIG. 3.

As stated above, FIGS. 3 and 4 particularly illustrate an embodiment in which sufficient pins are not available on each die to accommodate dedicated test pins. As a result, test pins must be multiplexed with pins used in normal operation. FIG. 3 is a plan view of a wafer containing unsingulated dice and another embodiment of a system for testing a plurality of circuits constructed according to the principles of the invention. FIG. 3 differs from FIG. 1 in at least three respects. First, the test bus 180 is routed among the dice in an alternative way. Second, a test pin select bus 310 augments the test bus 180 and includes various test pin select interconnects that couple each of the unsingulated dice in parallel as shown, or may pass through each of the unsingulated dice in series. Third, the unsingulated dice 120, 130 of FIG. 1 have been respectively renumbered to 320, 330 to indicate that they differ from those of FIG. 1 in a manner that will be evident with reference to FIG. 4.

FIG. 4 is a block diagram of a portion of the wafer of FIG. 3 and shows that the test pin select bus 310 is coupled to various unreferenced multiplexers associated with each of TDI 222a, TCKI 223a, TMSI 224a, TDO 222b, TCKO 223b, TMSO 224b, TDI 232a, TCKI 233a, TMSI 234a, TDO 232b, TCKO 233b and TMSO 234b as shown. The multiplexers allow their associated pins to act as test pins and pins used in normal operation, depending upon the state of a test pin select signal present on the test pin select bus 310. The inputs to the multiplexers that would carry signals used in normal operation are not shown.

Multiple circuits (e.g., unsingulated dice) may therefore be tested via a single contact region by the following method. First, the multiple circuits may be coupled to a tester (e.g., automatic JTAG test equipment). Power may then be applied to the multiple circuits. A test pin select signal may then be asserted via the contact region, which causes the multiplexers of the multiple circuits to configure test pins as shown in FIG. 4. A test clock signal may then be applied to the contact region, which the test bus then carries to each of the multiple circuits. Then appropriate test mode select signals may be applied to the contact region, and test instructions may be applied to the contact region. Then appropriate test mode select signals may be applied to the contact region, and test data may be applied to the contact region. Then appropriate test mode select signals may be applied to the contact region to initiate a test. Then appropriate test mode select signals may be applied to the contact region, and test data may be retrieved from the multiple circuits via the contact region and into the tester. Finally, the test pin select signal may be deasserted via the contact region, which causes the multiplexers of the multiple circuits to reconfigure test pins for normal operation.

Figure 5:
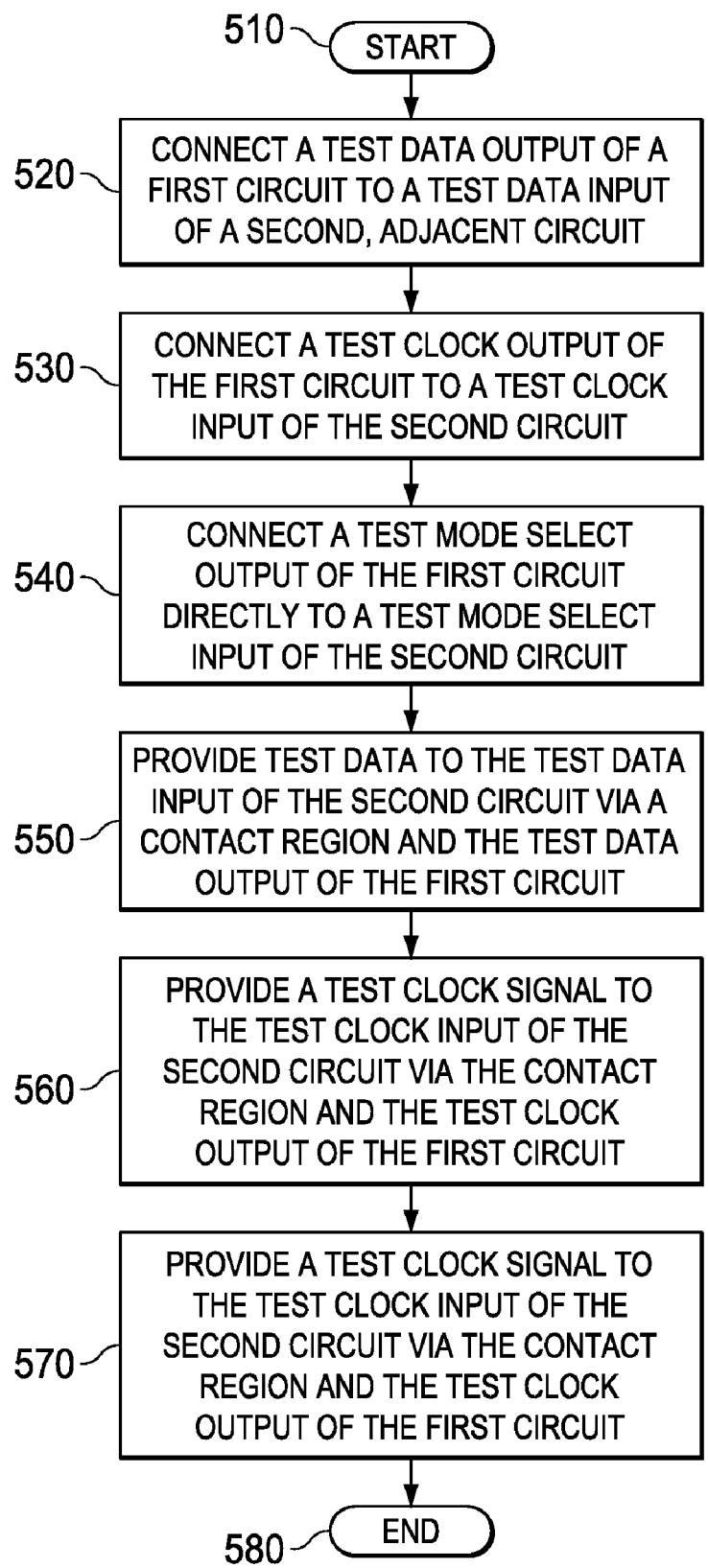
FIG. 5 is a flow diagram of one embodiment of a method of testing a plurality of circuits carried out according to the principles of the invention.

FIG. 5 is a flow diagram of one embodiment of a method of testing a plurality of circuits carried out according to the principles of the invention. The method begins in a start step 510. In a step 520, a test data output of a first circuit is connected directly to a test data input of a second circuit located adjacent to the first circuit. In a step 530, a test clock output of the first circuit is connected directly to a test clock input of the second circuit. In a step 540, a test mode select output of the first circuit is connected directly to a test mode select input of the second circuit.

If the plurality of circuits is unsingulated die, the steps 520, 530, 540 would typically be done during wafer fabrication. If the plurality of circuits is dice in an MCM, the steps 520, 530, 540 would typically be done during formation of the MCM. If the plurality of circuits are packaged ICs on a circuit board, the steps 520, 530, 540 would typically be done during assembly of the circuit board. If the plurality of circuits is wholly separate circuits, packaged or otherwise, the steps 520, 530, 540 would typically be done as a part of testing. The steps 520, 530, 540 need not be performed in any particular order.

In a step 550, test data is provided to the test data input of the second circuit via a contact region and the test data output of the first circuit. In a step 560, a test clock signal is provided to the test clock input of the second circuit via the contact region and the test clock output of the first circuit. In a step 570, a test mode select signal is provided to the test mode select input of the second circuit via the contact region and the test mode select output of the first circuit. The steps 550, 560, 570 need not be performed in any particular order. The method ends in an end step 580.

Those skilled in the art to which the invention relates will appreciate that other and further additions, deletions, substitutions and modifications may be made to the described embodiments without departing from the scope of the invention.

What is claimed is:

1. A system for testing a plurality of circuits, comprising:
   a test data interconnect that connects a test data output of a first circuit directly to a test data input of a second circuit located adjacent to said first circuit;

a test clock interconnect that connects a test clock output of said first circuit directly to a test clock input of said second circuit;

a test mode select interconnect that connects a test mode select output of said first circuit directly to a test mode select input of said second circuit; and a contact region coupled to provide test data, a test clock signal and a test mode select signal respectively to said test data interconnect, said test clock interconnect and said test mode select interconnect.

2. The system as recited in claim 1 wherein said test clock output of said first circuit is distal from a test clock input of said first circuit and said test mode select output of said first circuit is distal from a test mode select input of said first circuit.

3. The system as recited in claim 1 wherein said first circuit has a test clock input and a test mode select input, said first circuit is embodied in an unsingulated die, said test clock input and said test mode select input of said first circuit are at a first edge of said unsingulated die and said test clock output and said test mode select output of said first circuit are at a second edge of said unsingulated die opposite said first edge.

4. The system as recited in claim 1 wherein said test data interconnect, said test clock interconnect and said test mode select interconnect form part of a Joint Test Access Group (JTAG) bus.

5. The system as recited in claim 1 wherein said first and second circuits are unsingulated die of a wafer and have a single scribe line located therebetween and said test data interconnect, said test clock interconnect and said test mode select interconnect transversely cross said single scribe line.

6. The system as recited in claim 1 further comprising a multiplexer coupled to at least one selected from the group consisting of:
a test data input of said first circuit,
said test data output of said first circuit,
a test clock input of said first circuit,
said test clock output of said first circuit,
a test mode select input of said first circuit, and
said test mode select output of said first circuit.

7. The system as recited in claim 1 wherein said first and second circuits are unsingulated die of a wafer, said system further comprising a test pin select interconnect coupled to said first and second circuits and laterally crossing at least some scribe lines of said wafer.

8. A method of testing a plurality of circuits, comprising:
connecting a test data output of a first circuit directly to a test data input of a second circuit located adjacent to said first circuit;
connecting a test clock output of said first circuit directly to a test clock input of said second circuit;
connecting a test mode select output of said first circuit directly to a test mode select input of said second circuit;
providing test data to said test data input of said second circuit via a contact region and said test data output of said first circuit;
providing a test clock signal to said test clock input of said second circuit via said contact region and said test clock output of said first circuit; and
providing a test mode select signal to said test mode select input of said second circuit via said contact region and said test mode select output of said first circuit.

9. The method as recited in claim 8 wherein said test clock output of said first circuit is distal from a test clock input of said first circuit and said test mode select output of said first circuit is distal from a test mode select input of said first circuit.

10. The method as recited in claim 8 wherein said first circuit has a test clock input and a test mode select input, said first circuit is embodied in an unsingulated die, said test clock input and said test mode select input of said first circuit are at a first edge of said unsingulated die and said test clock output and said test mode select output of said first circuit are at a second edge of said unsingulated die opposite said first edge.

11. The method as recited in claim 8 wherein said test data interconnect, said test clock interconnect and said test mode select interconnect form part of a Joint Test Access Group (JTAG) bus.

12. The method as recited in claim 8 wherein said first and second circuits are unsingulated die of a wafer and have a single scribe line located therebetween and a test data interconnect coupling said test data output of said first circuit directly to said test data input of said second circuit, said test clock interconnect coupling said test clock output of said first circuit directly to said test data input of said second circuit and said test mode select interconnect coupling said test mode select output of said first circuit directly to said test mode select input of said second circuit transversely cross said single scribe line.

13. The method as recited in claim 8 further comprising a multiplexer coupled to at least one selected from the group consisting of:
a test data input of said first circuit,
said test data output of said first circuit,
a test clock input of said first circuit,
said test clock output of said first circuit,
a test mode select input of said first circuit, and
said test mode select output of said first circuit.

14. The method as recited in claim 8 wherein said first and second circuits are unsingulated die of a wafer, said method further comprising providing a test pin select signal to said first and second circuits via a test pin select interconnect that laterally crosses at least some scribe lines of said wafer.

15. A system for testing unsingulated dice on a wafer, comprising:
a test data interconnect that connects test data outputs of said unsingulated dice to test data inputs of said unsingulated dice;
a test clock interconnect that connects test clock outputs of said unsingulated dice directly to test clock inputs of said unsingulated dice;
a test mode select interconnect that connects test mode select outputs of said unsingulated dice to test mode select inputs of said unsingulated dice; and
a contact region coupled to provide test data, a test clock signal and a test mode select signal respectively to said test data interconnect, said test clock interconnect and said test mode select interconnect and receive test data from said test data interconnect.

16. The system as recited in claim 15 wherein said test clock outputs are distal from said test clock inputs and said test mode select outputs are distal from said test mode select inputs.

17. The system as recited in claim 15 wherein said test clock inputs and said test mode select inputs are at first edges of said unsingulated die and said test clock outputs and said test mode select outputs are at second edges of said unsingulated die opposite said first edges.

18. The system as recited in claim 15 wherein said test data interconnect, said test clock interconnect and said test mode select interconnect form part of a Joint Test Access Group (JTAG) bus.

19. The system as recited in claim 15 wherein unsingulated die have scribe lines located therebetween and said test data interconnect, said test clock interconnect and said test mode select interconnect transversely cross ones of said scribe lines.

20. The system as recited in claim 15 further comprising a multiplexer coupled to at least one selected from the group consisting of:
- a test data input of said first circuit,
- said test data output of said first circuit,
- a test clock input of said first circuit,
- said test clock output of said first circuit,
- a test mode select input of said first circuit, and
- said test mode select output of said first circuit.

21. The system as recited in claim 15 wherein said system further comprises a test pin select interconnect coupled to said unsingulated dice and laterally crossing at least some scribe lines of said wafer.

* * * * *